United States Patent
Choi et al.

(10) Patent No.: US 9,397,234 B2
(45) Date of Patent: Jul. 19, 2016

(54) PUMPING CAPACITOR

(71) Applicant: SAMSUNG ELECTRONICS CO., LTD., Suwon-si, Gyeonggi-do (KR)

(72) Inventors: Hyun-min Choi, Uiwang-si (KR); Ju-youn Kim, Suwon-si (KR); Hyun-jo Kim, Seoul (KR); Mu-kyeng Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/695,428

(22) Filed: Apr. 24, 2015

(65) Prior Publication Data
US 2016/0079446 A1   Mar. 17, 2016

(30) Foreign Application Priority Data
Sep. 17, 2014   (KR) .................. 10-2014-0123716

(51) Int. Cl.
| H01L 29/94 | (2006.01) |
| H01L 29/51 | (2006.01) |
| H01L 29/36 | (2006.01) |
| H01L 29/49 | (2006.01) |
| H01L 29/423 | (2006.01) |

(52) U.S. Cl.
CPC ............... *H01L 29/94* (2013.01); *H01L 29/36* (2013.01); *H01L 29/42312* (2013.01); *H01L 29/4966* (2013.01); *H01L 29/517* (2013.01)

(58) Field of Classification Search
CPC ..... H01L 29/94; H01L 29/36; H01L 29/4966; H01L 29/517; H01L 29/42312
USPC ......................................................... 257/296
See application file for complete search history.

(56) References Cited

U.S. PATENT DOCUMENTS

| 5,828,095 | A | 10/1998 | Merritt |
| 5,962,887 | A | 10/1999 | Manning et al. |
| 6,828,638 | B2 * | 12/2004 | Keshavarzi ......... H01L 27/0805 257/313 |
| 6,979,864 | B2 * | 12/2005 | Negoro ........... H01L 21/823857 257/335 |
| 7,667,268 | B2 * | 2/2010 | Disney ................ H01L 29/0638 257/335 |
| 7,902,632 | B2 | 3/2011 | Choi |
| 7,956,397 | B2 * | 6/2011 | Wada ..................... G11C 5/145 257/299 |
| 8,148,219 | B2 | 4/2012 | Tam et al. |
| 8,174,306 | B2 * | 5/2012 | Ikehashi ................. H02M 3/07 200/181 |
| 2003/0111682 | A1 | 6/2003 | Tanaka et al. |
| 2010/0226166 | A1 | 9/2010 | Jung et al. |
| 2013/0299922 | A1 * | 11/2013 | Choi ................ H01L 21/82345 257/412 |
| 2014/0078828 | A1 | 3/2014 | Gasquet et al. |
| 2014/0103415 | A1 | 4/2014 | Aebischer et al. |

FOREIGN PATENT DOCUMENTS

| JP | 1999-511904 A | 10/1999 |
| KR | 10-2006-0001305 A | 1/2006 |
| WO | WO 97/18588 A1 | 5/1997 |

* cited by examiner

*Primary Examiner* — Luan C Thai
(74) *Attorney, Agent, or Firm* — Lee & Morse, P.C.

(57) ABSTRACT

A pumping capacitor is provided. The pumping capacitor includes a substrate, a P-type gate layer on the substrate, and a gate dielectric layer between the substrate and the P-type gate layer. The substrate includes an N-type well region and an N-type doping region in the N-type well region.

25 Claims, 20 Drawing Sheets

PUMPING CAPACITOR

CROSS-REFERENCE TO RELATED APPLICATION

This application claims the benefit of Korean Patent Application No. 10-2014-0123716, filed on Sep. 17, 2014, in the Korean Intellectual Property Office, the disclosure of which is hereby incorporated by reference in its entirety.

BACKGROUND

1. Field

Provided is a pumping capacitor including a gate structure.

2. Description of the Related Art

With ongoing development and complication of integrated circuits (ICs) and systems, efficient management of powers and temperatures of the ICs and systems may be considered increasingly important in designing and embodying circuits. Some devices or circuits of the ICs or systems may require voltages having higher voltage levels than voltages supplied from power sources, and a pumping capacitor may be used.

SUMMARY

Embodiments may be realized by providing a pumping capacitor. The pumping capacitor includes a substrate including an N-type well region and an N-type doping region in the N-type well region, a P-type gate layer on the substrate, and a gate dielectric layer between the substrate and the P-type gate layer.

The P-type gate layer may have a P-type metal gate structure.

The N-type doping region may have a higher dopant concentration than the N-type well region.

The P-type gate layer may have a multilayered structure.

The P-type gate layer may include a metal nitride layer and a metal layer.

The metal layer may include one or more of aluminum (Al), tungsten (W), or titanium (Ti).

The metal nitride layer may be a multilayered structure including one or more of titanium nitride or tantalum nitride.

The gate dielectric layer may be a high-k dielectric layer having a higher dielectric constant than silicon oxide.

The high-k dielectric layer may include one or more of hafnium oxide, aluminum oxide, zirconium oxide, or tantalum oxide.

The pumping capacitor may, further include spacers covering sidewalls of the P-type gate layer, and a gate layer protection layer covering a top surface of the P-type gate layer.

Embodiments may be realized by providing a pumping capacitor. The pumping capacitor includes a substrate including an N-type well region and an N-type doping region in the N-type well region, a high-k dielectric layer on the substrate, the high-k dielectric layer having a U-shaped section, and a P-type metal gate layer on the high-k dielectric layer.

The P-type metal gate layer may include a first metal gate layer having a U-shaped section, and a second metal gate layer covering the first metal gate layer and having a T-shaped section.

The first metal gate layer may have a multilayered structure including one or more of titanium nitride or tantalum nitride, and the second metal gate layer may include one or more of aluminum, tungsten, or titanium.

The pumping capacitor may further include a gate layer protection layer covering a top surface of the P-type metal gate layer.

The substrate may include a semiconductor fin extending in a first direction, and the P-type metal gate layer may extend in a second direction that is perpendicular to the first direction, the P-type metal gate layer covering at least a portion of the semiconductor fin.

Embodiments may be realized by providing a pumping capacitor. The pumping capacitor includes a substrate including an N-type well region and an N-type doping region in the N-type well region, a P-type gate electrode on the substrate, and a gate dielectric layer interposed between the substrate and the P-type gate electrode. The N-type doping region has a higher dopant concentration than the N-type well region.

The P-type gate electrode may be a P-type metal electrode.

The substrate may further include a P-type well region, and a P-type guard ring electrode in the P-type well region.

The P-type guard ring electrode may have a higher dopant concentration than the P-type well region.

A self-bias may be applied to the N-type doping region, a gate bias may be applied to the P-type gate electrode, and a ground voltage may be applied to the P-type guard ring electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
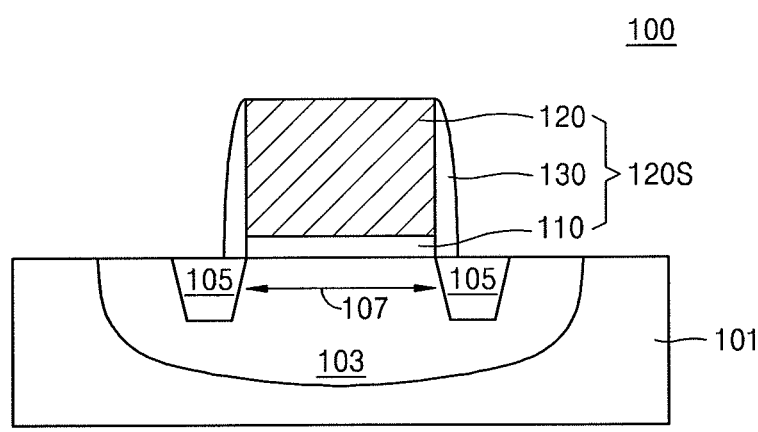
FIG. 1 illustrates a cross-sectional view of a pumping capacitor according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, expressions such as "at least one of," when preceding a list of elements, modify the entire list of elements and do not modify the individual elements of the list.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

Unless explicitly defined in a specific order herein, described respective operations may be performed otherwise. For example, the respective operations may be performed in a specified order, substantially at the same time, or in reverse order.

Variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing techniques.

FIG. 1 illustrates a cross-sectional view of a pumping capacitor 100 according to an exemplary embodiment.

Referring to FIG. 1, the pumping capacitor 100 may include a substrate 101 and a gate structure 120S formed on the substrate 101.

The substrate 101 may be, for example, a silicon (Si) substrate, a gallium arsenide (GaAs) substrate, a silicon germanium (SiGe) substrate, a ceramic substrate, a quartz substrate, or a glass substrate for a display. In some embodiments, the substrate 101 may be a semiconductor-on-insulator (SOI) substrate.

A first-conductivity-type well region 103 may be formed in an upper region of the substrate 101.

The substrate 101 may be a second-conductivity-type silicon substrate. For example, the substrate 101 may be a P-type silicon substrate, and the first-conductivity-type well region 103 may be an N-type well region. The N-type well region may be a region doped with impurities, such as phosphorus (P) at a low concentration. The N-type well region may have a dopant concentration of, for example, about $1\times10^{16}$ cm$^{-3}$.

First-conductivity-type doping regions 105 may be formed in upper regions of both edges of the first-conductivity-type well region 103. Each of the first-conductivity-type doping regions 105 may serve as a source/drain region.

Each of the first-conductivity-type doping regions 105 may be an N-type doping region doped at a higher concentration than the first-conductivity-type well region 103 by implanting impurities, such as phosphorus (P), arsenic (As), or antimony (Sb). The N-type doping region may have a dopant concentration of, for example, about $1\times10^{24}$ cm$^{-3}$.

An isolation layer may be formed outside the first-conductivity-type doping region 105 to isolate elements formed in the substrate 101. In some embodiments, the isolation layer may be an oxide layer formed using a local oxidation of silicon (LOCOS) process or a shallow trench isolation (STI) process.

A channel region 107 may be formed in a well region formed between the respective first-conductivity-type doping regions 105.

The channel region 107 may serve as a path through which N-type carriers contained in the first-conductivity-type doping region 105 are transported.

The gate structure 120S may be formed on a top surface of the substrate 101.

In some embodiments, the gate structure 120S may include a gate dielectric layer 110, a gate layer 120, and spacers 130.

The gate layer 120 may be disposed over the channel region 107 disposed in the substrate 101.

The present embodiment describes an example in which the gate layer 120 has a single layer structure. In an embodiment, for example, the gate layer 120 may have a multilayered structure.

In the present embodiment, the gate layer 120 may have a P-type metal gate structure.

In some embodiments, the gate layer 120 may have a P-type metal gate structure including a metal nitride layer and a metal layer. The metal nitride layer may have a multilayered structure including one or more of a titanium nitride (TiN) layer or a tantalum nitride (TaN) layer. The metal layer may include one or more of aluminum (Al), tungsten (W), or titanium (Ti). For example, the gate layer 120 may have a triple P-type metal gate structure including a lower layer including titanium nitride, a middle layer including tantalum nitride, and an upper layer including aluminum and tungsten.

In some other embodiments, the gate layer 120 may have a fourfold P-type metal gate structure including a lower layer including titanium nitride, a first middle layer including tantalum nitride, a second middle layer including titanium nitride, and an upper layer including aluminum and tungsten.

As described below with reference to FIGS. 6 and 7, the gate layer 120 may have a sixfold structure formed of TiN—TaN—TiN—TiAl—TiN—Ti/Al.

The gate layer 120 according to the present embodiment may have various other structures as long as the gate layer 120 has a P-type metal gate structure having a P-type work function.

A gate dielectric layer 110 may be interposed between the substrate 101 and the gate layer 120.

In some embodiments, the gate dielectric layer 110 may be a high-k dielectric layer having a higher dielectric constant than a silicon oxide layer. The high-k dielectric layer may include, for example, one or more of hafnium silicate, aluminum silicate, zirconium silicate, tantalum silicate, hafnium oxide, aluminum oxide, zirconium oxide, or tantalum oxide.

The spacers 130 may be formed to cover sidewalls of the gate dielectric layer 110 and the gate layer 120. In some embodiments, the spacer 130 may include one or more of silicon oxide or silicon nitride.

The number and size of the spacers 130 may be variously changed according to design conditions. The spacers 130 are shown with exemplary shapes in FIG. 1. In some embodiments, the height of the spacers 130 may be increased or reduced than shown in FIG. 1, and the thickness of the spacers 130 may be different than shown in FIG. 1. In some other embodiments, each of the spacers 130 may have a double spacer structure.

The shape of the spacers 130 shown in FIG. 1 are exemplary, and may be modified into, for example, an L shape.

When the gate layer 120 is formed of a metal material as in the present embodiment, a resistance of the gate layer 120 may become lower than when the gate layer 120 is formed of polysilicon (poly-Si), thereby increasing an operating speed of the pumping capacitor 100. Furthermore, when the gate layer 120 has a P-type metal gate structure, the pumping capacitor 100 may maintain operating reliability at a high voltage, and have improved time-dependent dielectric breakdown (TDDB) characteristics as will be described in detail with reference to FIGS. 3 and 4.

Figure 2:
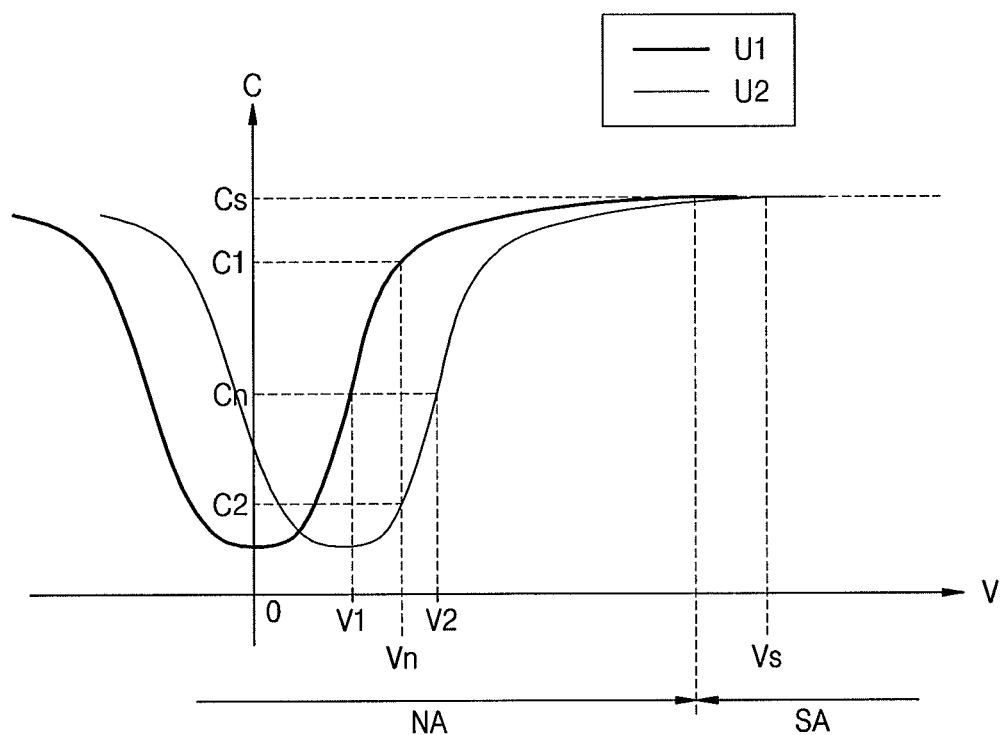
FIG. 2 illustrates a graph of capacitance-voltage (C-V) characteristics of each of a case in which a gate layer has an N-type metal gate structure and a case in which a gate layer has a P-type metal gate structure according to exemplary embodiments.

FIG. 2 illustrates a graph of capacitance-voltage (C-V) characteristics of each of a case in which a gate layer has an N-type metal gate structure and a case in which a gate layer has a P-type metal gate structure according to exemplary embodiments.

The graph of FIG. 2 will be described with cross-reference to some elements shown in FIG. 1.

In FIG. 2, reference numeral U1 denotes a curve of C-V characteristics of the gate layer 120 when the gate layer 120 has the N-type metal gate structure.

Reference numeral U2 denotes a curve of C-V characteristics of the gate layer 120 when the gate layer 120 has the P-type metal gate structure.

In FIG. 2, the curve U2 shows results obtained by shifting the curve U1 in the direction of a voltage V. For example, a voltage V2 of the curve U1 and a voltage V2 of the curve U2, which correspond to the same capacitance Cn in a non-saturation area NA, have different values. Similarly, a capacitance C1 of the curve U1 and a capacitance C2 of the curve U2, which correspond to the same voltage Vn in the non-saturation area NA, have different values.

In a saturation area SA, the curves U1 and U2 have substantially the same capacitance Cs or approximate capacitances Cs at the same voltage Vs, and similar to the case of the curve U1, the pumping capacitor 100 may serve a required function in a pumping circuit in the case of the curve U2.

Figure 3:
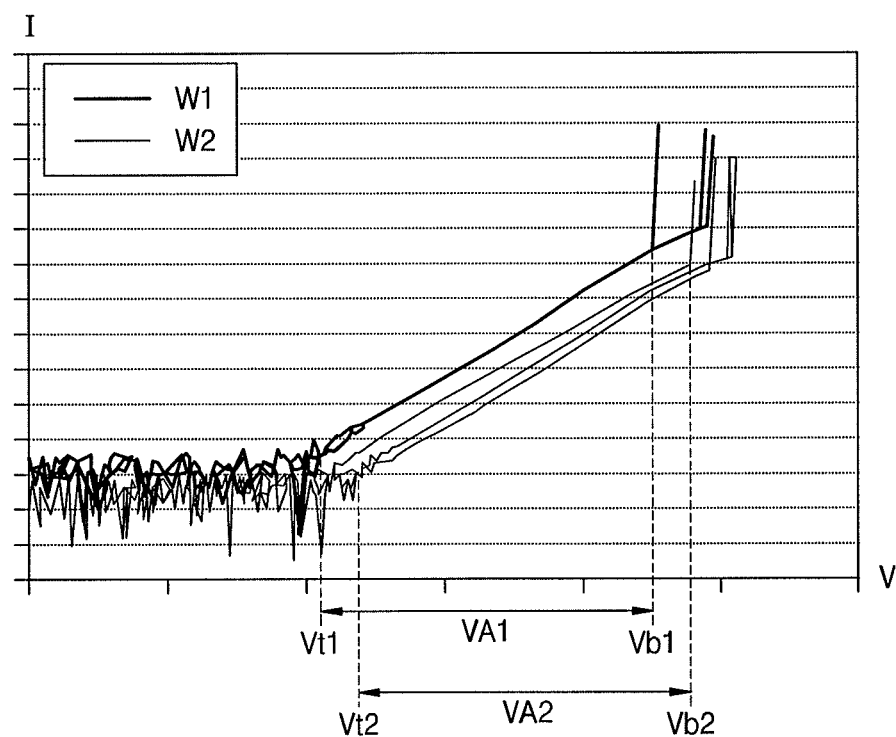
FIG. 3 illustrates a graph of current-voltage (I-V) characteristics of each of a case in which a gate layer has an N-type metal gate structure and a case in which a gate layer has a P-type metal gate structure according to exemplary embodiments.

FIG. 3 illustrates a graph of current-voltage (I-V) characteristics of each of a case in which a gate layer has an N-type metal gate structure and a case in which a gate layer has a P-type metal gate structure according to exemplary embodiments.

The graph of FIG. 3 will be described with cross-reference to some elements shown in FIGS. 1 and 2.

In FIG. 3, reference numeral W1 denotes a curve of I-V characteristics of the pumping capacitor 100 when the gate layer 120 has the N-type metal gate structure.

Reference numeral W2 denotes a curve of I-V characteristics of the pumping capacitor 100 when the gate layer 120 has the P-type metal gate structure.

For the analysis of FIG. 3, it is assumed that the pumping capacitor 100 has the same structure except that the gate layer 120 has the N-type metal gate structure or the P-type metal gate structure.

In FIG. 3, an operating voltage section VA2 of the curve W2 shows results obtained by shifting an operating voltage section VA1 of the curve W1 in the direction of a voltage V.

For example, a threshold voltage Vt2 and a breakdown voltage Vb2 of the curve W2 are respectively higher than a threshold voltage Vt1 and a breakdown voltage Vb1 of the curve W1.

When the gate layer 120 of the pumping capacitor 100 has the P-type metal gate structure, the pumping capacitor 100 may stably ensure an operating voltage margin and maintain operating reliability at high voltages.

Figure 4:
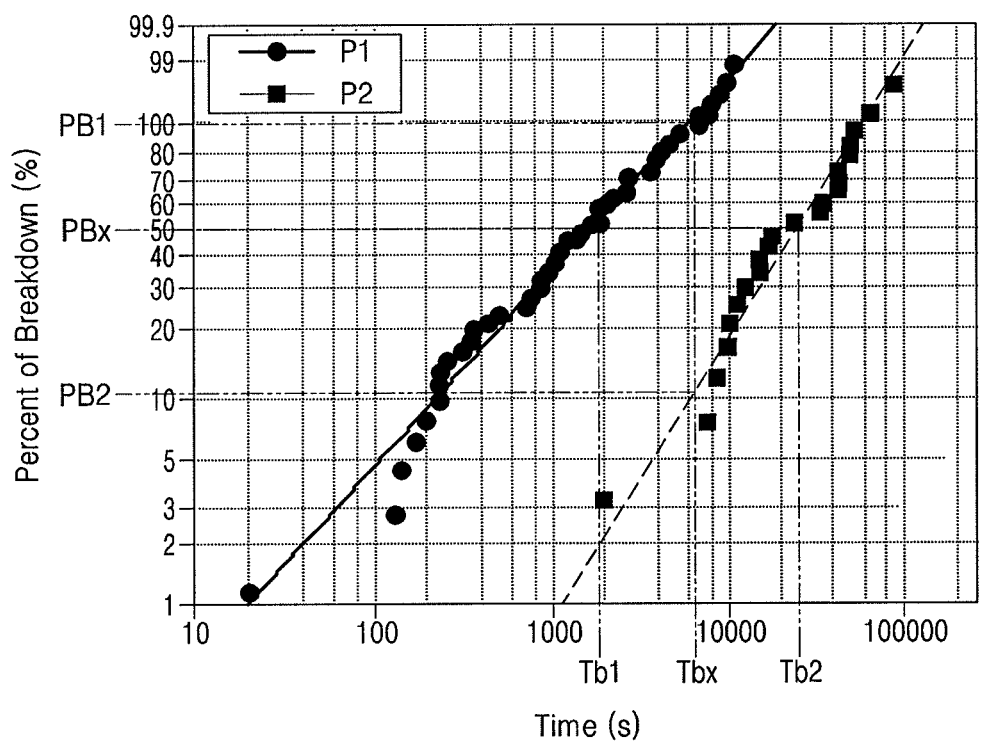
FIG. 4 illustrates a graph of time-dependent dielectric breakdown (TDDB) characteristics in each of a case in which a gate layer has an N-type metal gate structure and a case in which a gate layer has a P-type metal gate structure according to exemplary embodiments.

FIG. 4 illustrates a graph of time-dependent dielectric breakdown (TDDB) characteristics in each of a case in which a gate layer has an N-type metal gate structure and a case in which a gate layer has a P-type metal gate structure according to exemplary embodiments.

The graph of FIG. 4 will be described with cross-reference to some elements shown in FIGS. 1 through 3.

In FIG. 4, reference numeral P1 denotes a curve of TDDB characteristics of the pumping capacitor 100 when the gate layer 120 has an N-type metal gate structure.

Reference numeral P2 denotes a curve of TDDB characteristics of the pumping capacitor 100 when the gate layer 120 has a P-type metal gate structure.

For the analysis of FIG. 4, it is assumed that the pumping capacitor 100 has the same structure except that the gate layer 120 has the N-type metal gate structure or the P-type metal gate structure.

In FIG. 4, even if the pumping capacitor 100 operates for the same time duration, the curves P1 and P2 are different from each other in percentage of breakdown. For example, in the cases of the curves P1 and P2, when the pumping capacitor 100 operates for a specific time Tbx, it can be observed that a percentage PB2 of breakdown in the case of the curve P2 is much lower than a percentage PB1 of breakdown in the case of the curve P1. In other words, an operation time of the curve P2 is longer than an operation time Tb1 of the curve P1 at the same percentage PBx of breakdown.

When the gate layer 120 of the pumping capacitor 100 has a P-type metal gate structure, operating reliability of the pumping capacitor 100 may be increased.

Figure 5:
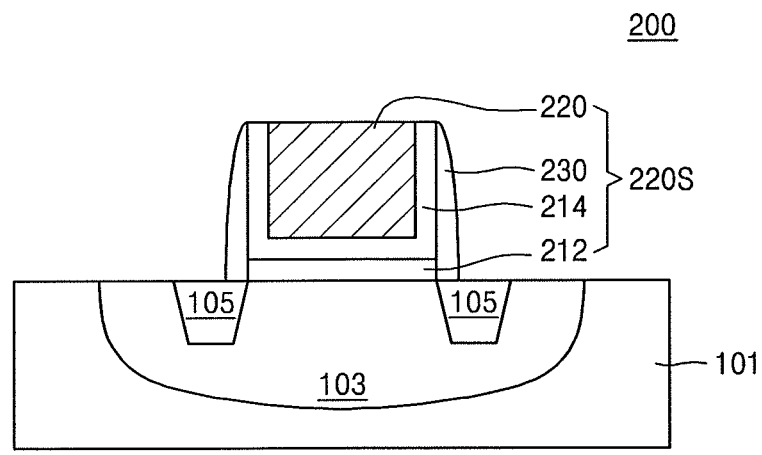
FIG. 5 illustrates a cross-sectional view of a pumping capacitor according to an exemplary embodiment.

FIG. 5 illustrates a cross-sectional view of a pumping capacitor 200 according to an exemplary embodiment.

In FIG. 5, the same reference numerals are used to denote the same elements as in FIGS. 1 through 4, and repeated descriptions thereof are omitted for brevity.

The pumping capacitor 200 according to the present embodiment may have a similar structure to the pumping capacitor 100 described with reference to FIG. 1 except for a gate structure 220S.

Referring to FIG. 5, the pumping capacitor 200 may include a substrate 101 and a gate structure 220S formed on the substrate 101.

The gate structure 220S may include an interface layer 212, a gate dielectric layer 214, a gate layer 220, and spacers 230.

The interface layer 212 may serve to prevent formation of a poor interface between the substrate 101 and the gate dielectric layer 214.

The interface layer 212 may include a low-k dielectric material having a dielectric constant of about 9 or less. In some embodiments, the interface layer 212 may include silicon oxide having a dielectric constant of about 4 or silicon oxynitride having a dielectric constant of about 4 to about 8. In some other embodiments, the interface layer 212 may include silicate.

The gate dielectric layer 214 may be formed on the interface layer 212. Similar to the gate dielectric layer 110 described with reference to FIG. 1, the gate dielectric layer 214 may be a high-k dielectric layer having a higher dielectric constant than a silicon oxide layer.

Unlike FIG. 1, the gate dielectric layer 214 according to the present embodiment may have a U-shaped section. For example, the gate dielectric layer 214 may have such a structure to cover bottom and side surfaces of the gate layer 220.

The gate layer 220 may be formed on the gate dielectric layer 214.

Similar to the gate layer 120 described with reference to FIG. 1, the gate layer 220 according to the present embodiment may have various structures as long as the gate layer 220 has a P-type metal gate structure having a P-type work function. Meanwhile, the gate layer 220 may differ from the gate layer 120 described with reference to FIG. 1 in that the side surfaces of the gate layer 220 are covered with the gate dielectric layer 214.

The gate structure 220S according to the present embodiment may be formed using a replacement metal gate (RMG) process, and the gate layer 220 may not be affected by a thermal process, such as an annealing process. The RMG process will be described in detail later with reference to FIGS. 10A through 10F.

Figure 6:
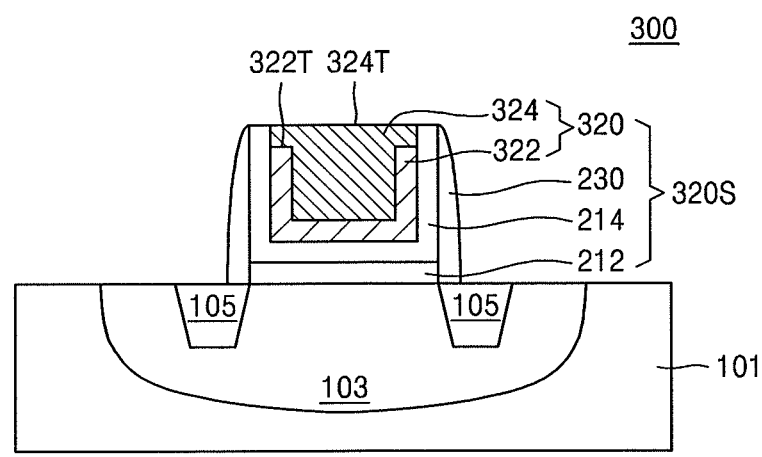
FIG. 6 illustrates a cross-sectional view of a pumping capacitor according to an exemplary embodiment.

FIG. 6 illustrates a cross-sectional view of a pumping capacitor 300 according to an exemplary embodiment.

In FIG. 6, the same reference numerals are used to denote the same elements as in FIGS. 1 through 5, and repeated descriptions thereof are omitted for brevity.

The pumping capacitor 300 according to the present embodiment may have a similar structure to the pumping capacitors 100 and 200 described with reference to FIGS. 1 through 5, except for a gate structure 320S.

Referring to FIG. 6, the pumping capacitor 300 may include a substrate 101 and a gate structure 320S formed on the substrate 101. The gate structure 320S may include an interface layer 212, a gate dielectric layer 214, a gate layer 320, and spacers 230.

A gate layer 320 may be formed on the gate dielectric layer 214. The gate layer 320 may include a first metal gate layer 322 and a second metal gate layer 324.

The first metal gate layer 322 may be foamed on the gate dielectric layer 214 to have a U-shape section.

In some embodiments, the first metal gate layer 322 may have a multilayered structure including one or more of titanium nitride or tantalum nitride. For example, the first metal gate layer 322 may be a triple layer including a lower layer including titanium nitride, a middle layer including tantalum nitride, and an upper layer including titanium nitride.

In the present embodiment, a top surface 322T of an edge of the first metal gate layer 322 may be disposed at a lower level than a top surface 324T of the second metal gate layer 324. In an embodiment, for example, the top surface 322T of the edge of the first metal gate layer 322 may be formed at the same level as the top surface 324T of the second metal gate layer 324.

The second metal gate layer 324 may be formed to cover the first metal gate layer 322 but not to expose the first metal gate layer 322.

The second metal gate layer 324 may have a multilayered structure including a metal nitride layer including one or more of titanium nitride or tantalum nitride and a metal layer including one or more of aluminum, tungsten, or titanium. For example, the second metal gate layer 324 may be a triple layer including a lower layer including titanium aluminide (TiAl), a middle layer including titanium nitride, and an upper layer including one or more of titanium or aluminum.

The gate layer 320 may have a multilayered P-type metal gate structure including a first metal gate layer 322 and a second metal gate layer 324. For example, the gate layer 320 may have a sixfold P-type metal gate structure formed of TiN—TaN—TiN—TiAl—TiN—Ti/Al.

A blocking layer may be further formed in a region of the top surface 324T of the second metal gate layer 324 by performing an oxidation process during a planarization process that will be described later with reference to FIG. 11E.

When the second metal gate layer 324 includes the upper layer including titanium and aluminum as described above, the blocking layer may be an aluminum oxide layer.

When the blocking layer is formed on the second metal gate layer 324, the blocking layer may serve to prevent the second metal gate layer 324 from being exposed.

The gate structure 320S according to the present embodiment may be formed using a replacement metal gate (RMG) process similar to the gate structure 220S described above with reference to FIG. 5.

Figure 7:
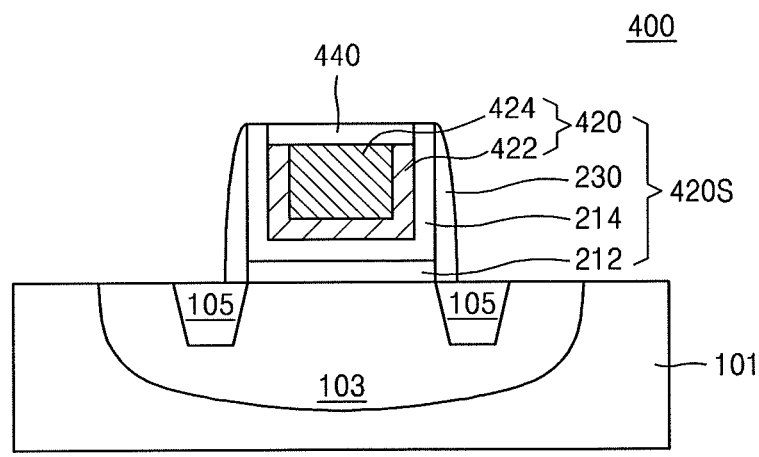
FIG. 7 illustrates a cross-sectional view of a pumping capacitor according to an exemplary embodiment.

FIG. 7 illustrates a cross-sectional view of a pumping capacitor 400 according to an exemplary embodiment.

In FIG. 7, the same reference numerals are used to denote the same elements as in FIGS. 1 through 6, and repeated descriptions thereof are omitted for brevity.

The pumping capacitor 400 according to the present embodiment may have a similar structure to the pumping capacitors 100, 200, and 300 described with reference to FIGS. 1 through 6, except for a gate structure 420S.

Referring to FIG. 7, the pumping capacitor 400 may include a substrate 101 and a gate structure 420S formed on the substrate 101. The gate structure 420S may include an interface layer 212, a gate dielectric layer 214, a gate layer 420, spacers 230, and a gate layer protection layer 440.

The gate layer 420 may be formed on the gate dielectric layer 214.

Similar to the gate layer 320 described with reference to FIG. 6, the gate layer 420 may have a multilayered P-type metal gate structure including a first metal gate layer 422 and a second metal gate layer 424. For example, the gate layer 420 may have a sixfold P-type metal gate structure formed of TiN—TaN—TiN—TiAl—TiN—Ti/Al.

A gate layer protection layer 440 may be formed to cover a top surface of the gate layer 420, and prevent the gate layer 420 from being exposed.

The gate layer protection layer 440 may include, for example, a silicon oxide layer or a silicon nitride layer.

Figure 8A:
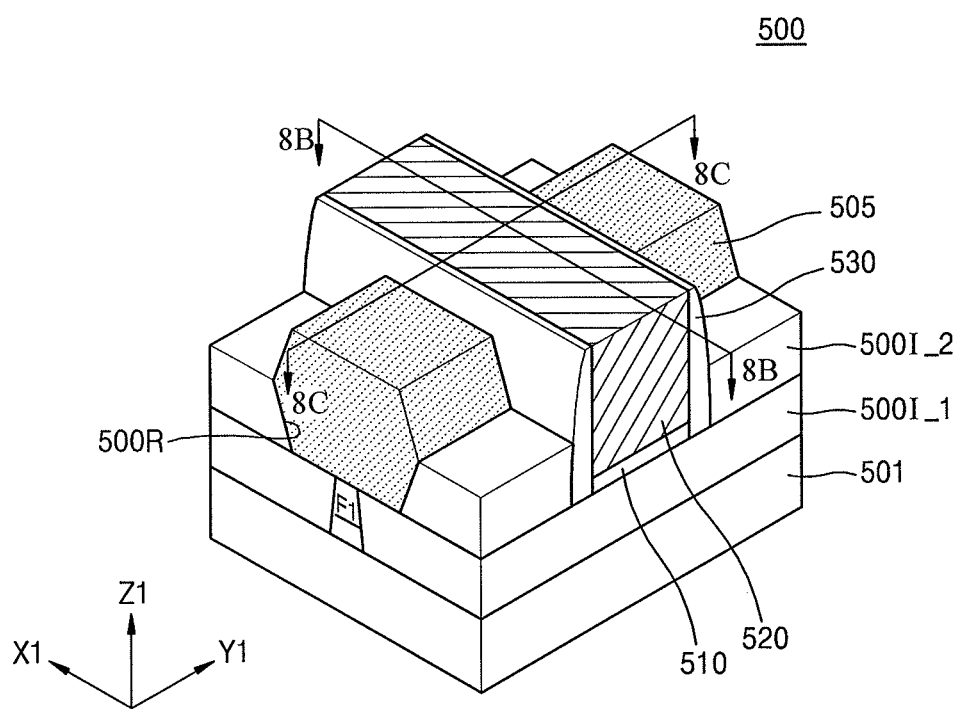
FIG. 8A illustrates a perspective view of a pumping capacitor according to an exemplary embodiment.
Figure 8B:
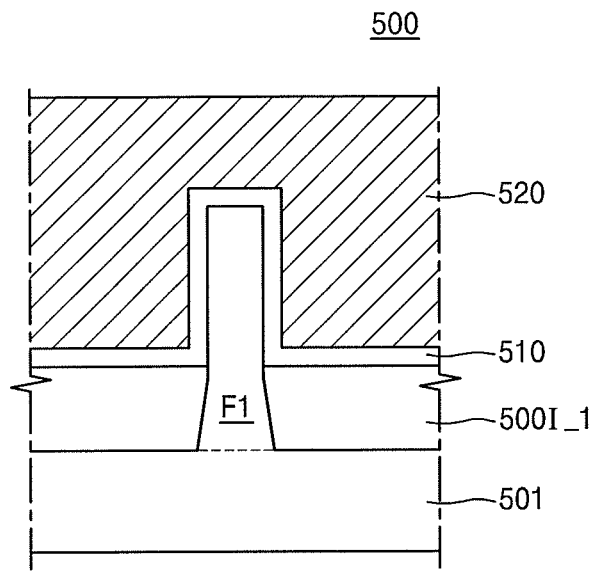
FIG. 8B illustrates a cross-sectional view taken along line 8B-8B of FIG. 8A.

FIG. 8A illustrates a perspective view of a pumping capacitor 500 according to an exemplary embodiment. FIG. 8B is a cross-sectional view taken along line 8B-8B of FIG. 8A, and FIG. 8C is a cross-sectional view taken along line 8C-8C of FIG. 8A.

Figure 8C:
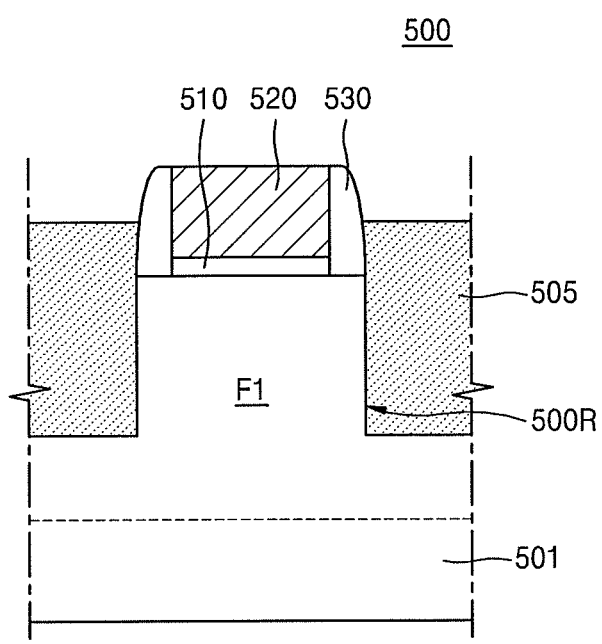
FIG. 8C illustrates a cross-sectional view taken along line 8C-8C of FIG. 8A.

In FIGS. 8A through 8C, the same reference numerals are used to denote the same elements as in FIGS. 1 through 7, and repeated descriptions thereof are omitted for brevity.

Referring to FIGS. 8A through 8C, the pumping capacitor 500 may include a substrate 501 having a semiconductor fin F1, a first-conductivity-type doping region 505, a gate dielectric layer 510, a gate layer 520, spacers 530, and a second interlayer insulating layer 500I_2.

The semiconductor fin F1 may extend in a second direction (Y-axis direction). In some embodiments, the semiconductor fin F1 may be a portion of the substrate 501 or include an epitaxial layer grown from the substrate 501.

In some embodiments, the semiconductor fin F1 may function as an N-type well region formed by implanting impurities, such as phosphorus (P), at a low concentration. The first interlayer insulating layer 500I_1 may cover side surfaces of the semiconductor fin F1.

The gate layer 520 may be formed to intersect the semiconductor fin F1 on the semiconductor fin F1. For example, the gate layer 520 may extend in a first direction (X-axis direction).

In some embodiments, the gate layer 520 may have a P-type metal gate structure. The gate layer 520 may have a stack structure similar to the gate layer 120 described with reference to FIG. 1.

The gate dielectric layer 510 may be formed on a bottom surface of the gate layer 520. Similar to the gate dielectric layer 110 described with reference to FIG. 1, the gate dielectric layer 510 may be a high-k dielectric layer having a higher dielectric constant than a silicon oxide layer.

The spacers 530 may be formed to cover sidewalls of the gate dielectric layer 510 and the gate layer 520. In some embodiments, the spacers 530 may include one or more of silicon oxide or silicon nitride.

The second interlayer insulating layer 500I_2 may be formed on the first interlayer insulating layer 500I_1 to cover at least portions of outer side surfaces of the spacers 530. Recesses 500R may be formed in the second interlayer insulating layer 500I_2.

In some embodiments, a side surface of the recess 500R may have an inclined structure. For example, the recess 500R may widen far away from a top surface of the substrate 501 in a third direction (Z-axis direction).

The first-conductivity-type doping region 505 may be formed in the recess 500R. Each of first-conductivity-type doping regions 505 may serve as a source/drain region. The first-conductivity-type doping region 505 may be an N-type doping region similar to the first-conductivity-type doping region 105 described with reference to FIG. 1.

A top surface of the first-conductivity-type doping region 505 may be at a higher level than a top surface of the first interlayer insulating layer 500I_1 and a top surface of the second interlayer insulating layer 500I_2.

Figure 9A:
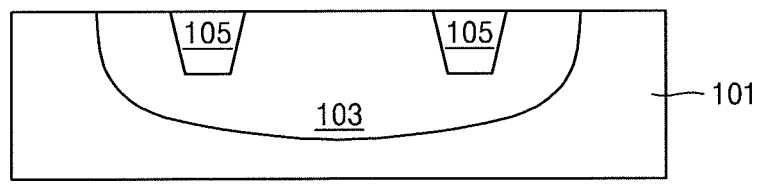
FIGS. 9A through 9C illustrate cross-sectional views of processes of a method of fabricating a pumping capacitor according to an exemplary embodiment.
Figure 9B:
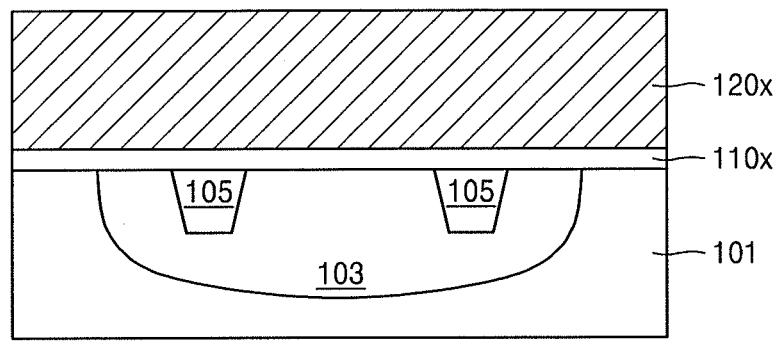
Figure 9C:
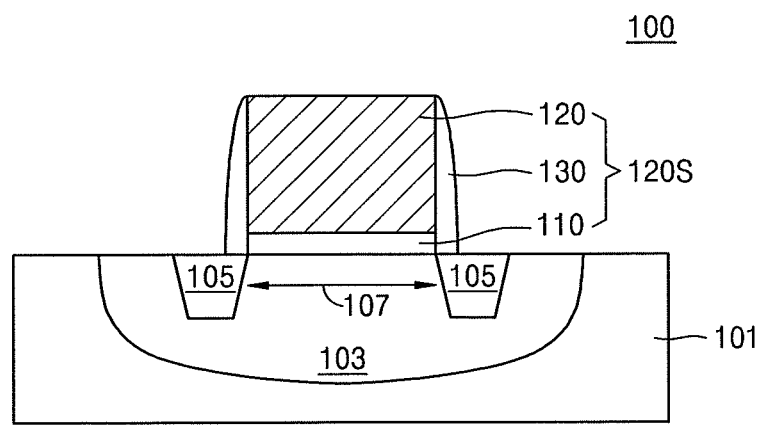

FIGS. 9A through 9C illustrate cross-sectional views of processes of a method of fabricating a pumping capacitor according to an exemplary embodiment.

In FIGS. 9A through 9C, the same reference numerals are used to denote the same elements as in FIGS. 1 through 7, and repeated descriptions thereof are omitted for brevity.

Referring to FIG. 9A, a substrate 101 having a first-conductivity-type well region 103 and a first-conductivity-type doping region 105 may be prepared.

For example, the substrate 101 may be a P-type silicon substrate, the first-conductivity-type well region 103 may be an N-type well region, and the first-conductivity-type doping region 105 may be an N-type doping region. In this case, the first-conductivity-type well region 103 may be formed by implanting impurities, such as phosphorus (P), at a low concentration, and the first-conductivity-type doping region 105 may be formed by implanting impurities, such as phosphorus (P), arsenic (As), or antimony (Sb) at a higher concentration than the first-conductivity-type well region 103.

Referring to FIG. 9B, a gate dielectric layer 110x and a gate layer 120x may be sequentially formed on the substrate 101.

The gate dielectric layer 110x may be a high-k dielectric layer having a higher dielectric constant than a silicon oxide layer. The high-k dielectric layer may include, for example, one or more of hafnium silicate, aluminum silicate, zirconium silicate, tantalum silicate, hafnium oxide, aluminum oxide, zirconium oxide, or tantalum oxide.

The gate dielectric layer 110x including hafnium oxide may be deposited using, for example, $HfCl_4$ or a $H_2O$ reactant, or by performing an atomic layer deposition (ALD) process using an alkyl-amido-based hafnium (Hf) precursor, $H_2O$, or $O_3$.

Alternatively, the gate dielectric layer 110x may be deposited using a chemical vapor deposition (CVD) process using a Hf precursor, such as Hf-t-buxoxide or Hf-1-methoxy-2-methyl-2-propanol (Hf-MMP), and $O_2$, $O_3$, or radical oxygen.

In some embodiments, after the gate dielectric layer 110x is formed, a post-deposition annealing (PDA) process may be performed to densify the gate dielectric layer 110x. The PDA process may be performed at a temperature of about 550° C. to about 1050° C. in an atmosphere containing one or more of N2, NO, N2O, $O_2$, or $NH_3$.

Similar to that described with reference to FIG. 1, the gate layer 120x may be formed to have a multilayered structure, for example, a fourfold structure formed of TiN/TaN/TiN/Al. For example, the gate layer 120x including titanium nitride may be deposited using an ALD process or a CVD process using $TiCl_4$ and $NH_3$ as precursors.

Referring to FIG. 9C, a photolithography process and an etching process may be performed on the stack structure (refer to FIG. 9B) in which the gate dielectric layer 110x and the gate layer 120x are stacked, thereby forming a gate dielectric layer 110 and a gate layer 120.

Thereafter, spacers 130 may be formed to cover sidewalls of the gate dielectric layer 110 and the gate layer 120.

A gate layer protection layer may be further formed on a top surface of the gate layer 120 to prevent the gate layer 120 from being exposed.

Figure 10A:
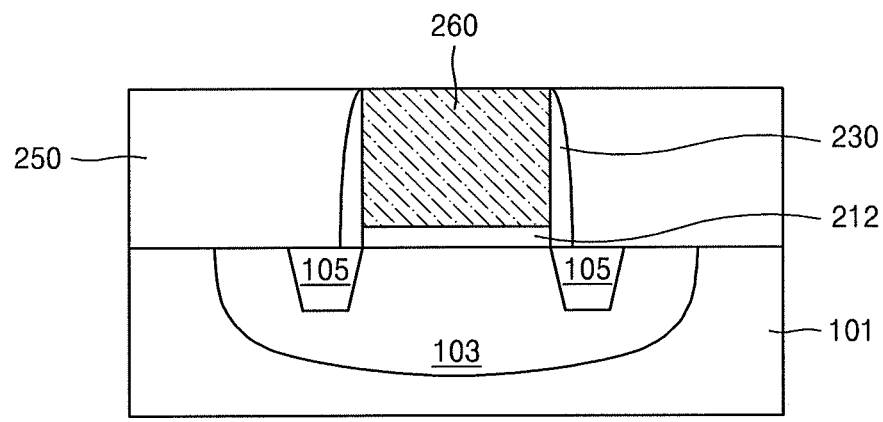
FIGS. 10A through 10F illustrate cross-sectional views of processes of a method of fabricating a pumping capacitor according to an exemplary embodiment.

FIGS. 10A through 1OF illustrate cross-sectional views of processes of a method of fabricating a pumping capacitor according to an exemplary embodiment.

In FIGS. 10A through 10F, the same reference numerals are used to denote the same elements as in FIGS. 1 through 9C, and repeated descriptions thereof are omitted for brevity.

Referring to FIG. 10A, a substrate 101 having a first-conductivity-type well region 103 and a first-conductivity-type doping region 105 may be prepared. An interface layer 212 and a sacrificial gate layer 260 may be sequentially formed on the substrate 101. The sacrificial gate layer 260 may be, for example, a silicon nitride layer.

In some embodiments, the formation of the first-conductivity-type doping region 105 may include forming the interface layer 212 and the sacrificial gate layer 260 and performing an ion implantation process using the sacrificial gate layer 260 as a mask.

Subsequently, spacers 230 may be formed to cover sidewalls of the interface layer 212 and the sacrificial gate layer 260.

Next, after an insulating layer is formed on the substrate 101 to cover the sacrificial gate layer 260, the insulating layer may be planarized until a top surface of the sacrificial gate layer 260 is exposed, thereby forming an interlayer insulating layer 250.

Figure 10B:
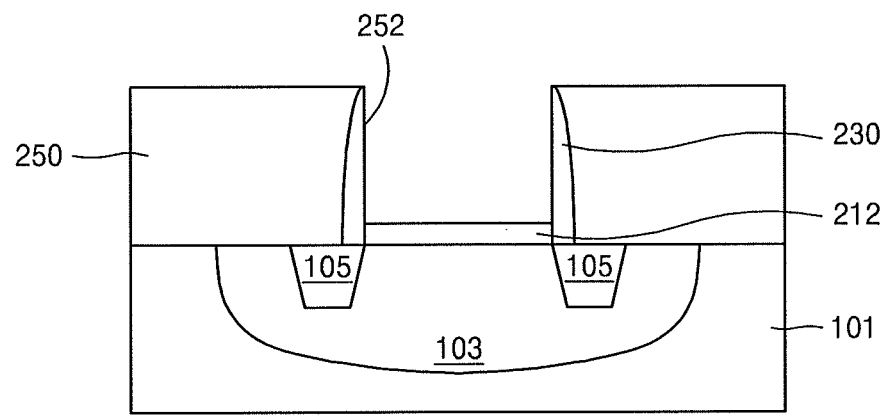

Referring to FIG. 10B, the sacrificial gate layer (refer to 260 in FIG. 10A) having the exposed top surface may be removed.

The removal of the sacrificial gate layer 260 may be performed using various processes used for an RMG process.

For example, the removal of the sacrificial gate layer 260 may include removing a portion of the sacrificial gate layer 260 using a light stream wet etching process and removing the remaining sacrificial gate layer 260 using an ashing process.

When the sacrificial gate layer 260 is removed using a two-step process (i.e., a light stream wet etching process and an ashing process), over-etching may be prevented unlike a case in which the sacrificial gate layer 260 is removed using a one-time etching process.

In an embodiment, the sacrificial gate layer 260 may be removed using a single process.

By removing the sacrificial gate layer 260, a trench 252 may be formed by a top surface of the interface layer 212 and sidewalls of the interlayer insulating layer 250.

Figure 10C:
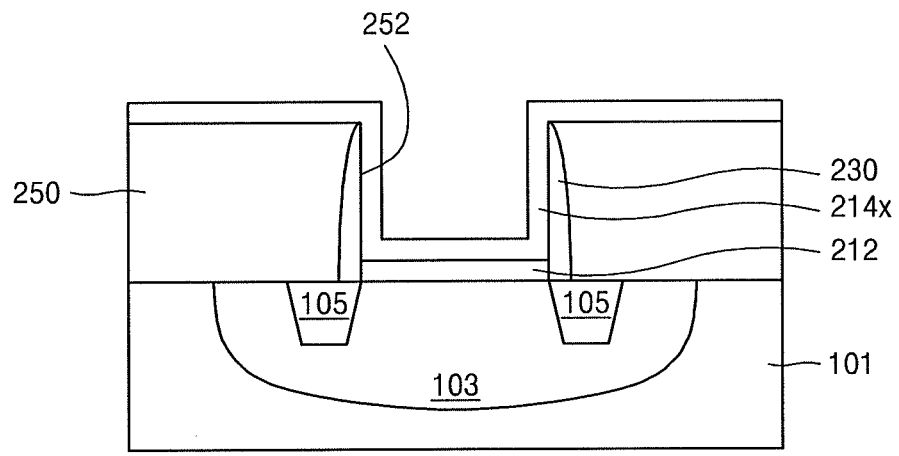

Referring to FIG. 10C, a gate dielectric layer 214*x* may be formed to cover a top surface of the interlayer insulating layer 250 and an inner wall of the trench 252. The formation of the gate dielectric layer 214*x* may be performed using a deposition process, such as an ALD process or a CVD process.

In some embodiments, after the gate dielectric layer 214*x* is performed, a PDA process may be performed to densify the gate dielectric layer 214*x*.

Figure 10D:
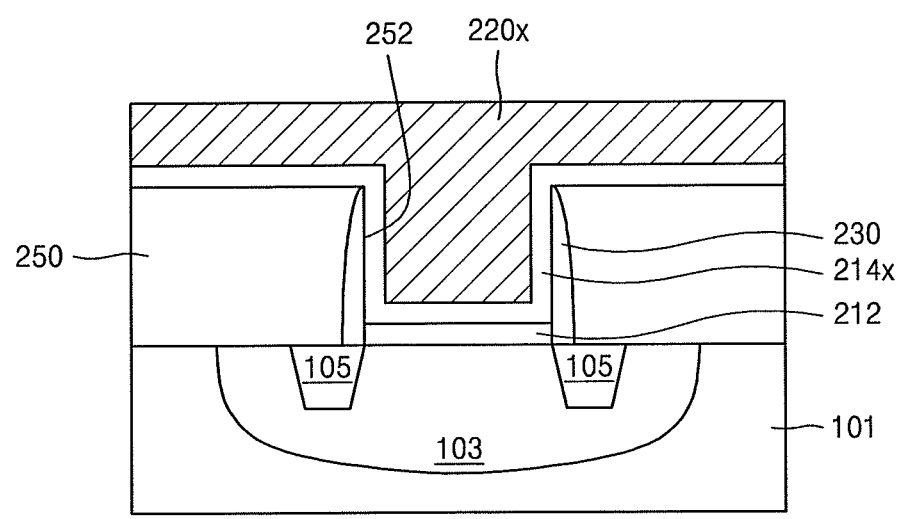

Referring to FIG. 10D, a gate layer 220*x* may be formed on the gate dielectric layer 214*x*. The gate layer 220*x* may be formed using a deposition process, such as an ALD process or a CVD process.

Similar to that described with reference to FIG. 1, the gate layer 220*x* may have a multilayered structure, for example, a fourfold structure formed of TiN/TaN/TiN/Al.

Figure 10E:
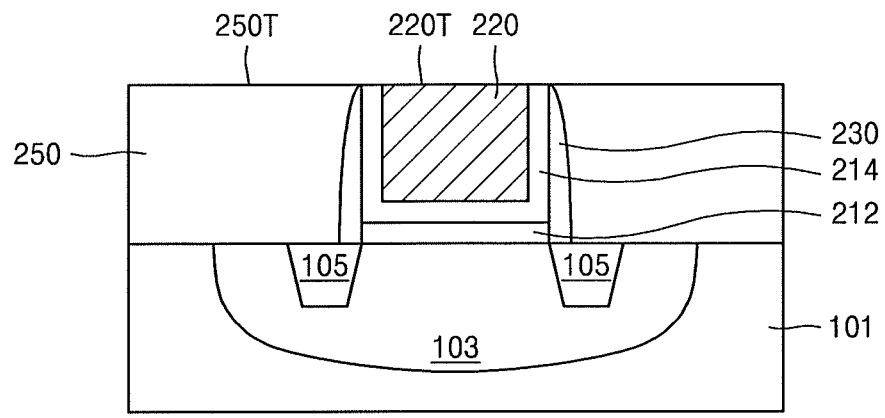

Referring to FIG. 10E, a planarization process may be performed on a gate layer (refer to 220*x* in FIG. 10D) and a gate dielectric layer (refer to 214*x* in FIG. 10D) to expose a top surface 250T of the interlayer insulating layer 250. The planarization process may be, for example, a chemical mechanical polishing (CMP) process.

A blocking layer may be further formed in a region of a top surface 220T of the gate layer 220 by performing an oxidation process during the planarization process. When the gate layer 220 has a fourfold structure including an aluminum layer serving as an uppermost layer as described with reference to FIG. 10D, the blocking layer may be an aluminum oxide layer.

Figure 10F:
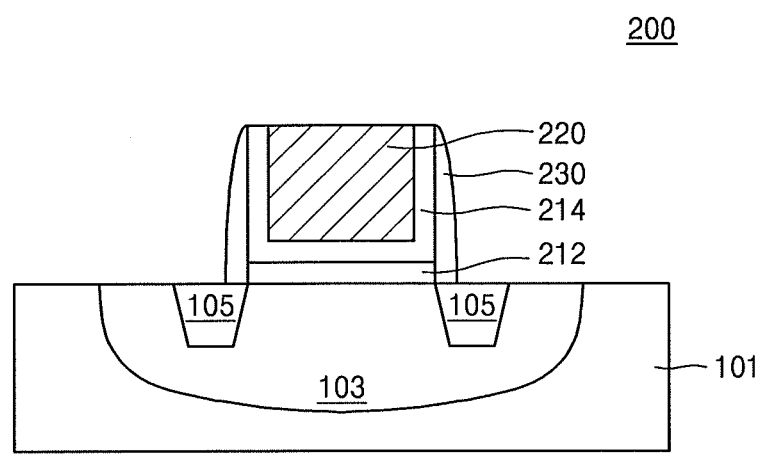

Referring to FIG. 10F, the interlayer insulating layer 250 may be removed to complete a pumping capacitor 200. The removal of the interlayer insulating layer 250 may be performed using, for example, a wet etching process.

FIGS. 11A through 11K are cross-sectional views of processes of a method of fabricating a pumping capacitor according to an exemplary embodiment.

In FIGS. 11A through 11K, the same reference numerals are used to denote the same elements as in FIGS. 1 through 10F, and repeated descriptions thereof are omitted for brevity.

Figure 11A:
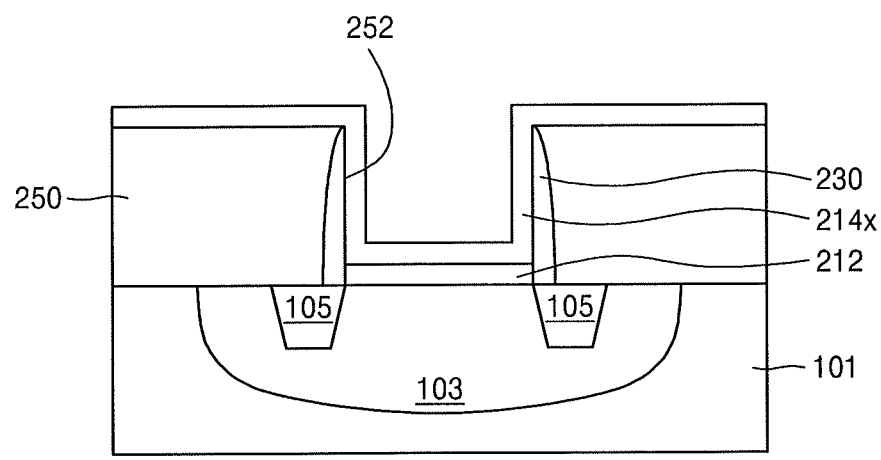
FIGS. 11A through 11I illustrate cross-sectional views of processes of a method of fabricating a pumping capacitor according to an exemplary embodiment.

Referring to FIG. 11A, a trench 252 and a gate dielectric layer 214*x* may be formed on a substrate 101. The gate dielectric layer 214*x* may be formed to cover inner walls of the trench 252. Since methods of forming the trench 252 and the gate dielectric layer 214*x* are described above with reference to FIGS. 10A through 10C, descriptions thereof are omitted here.

Figure 11B:
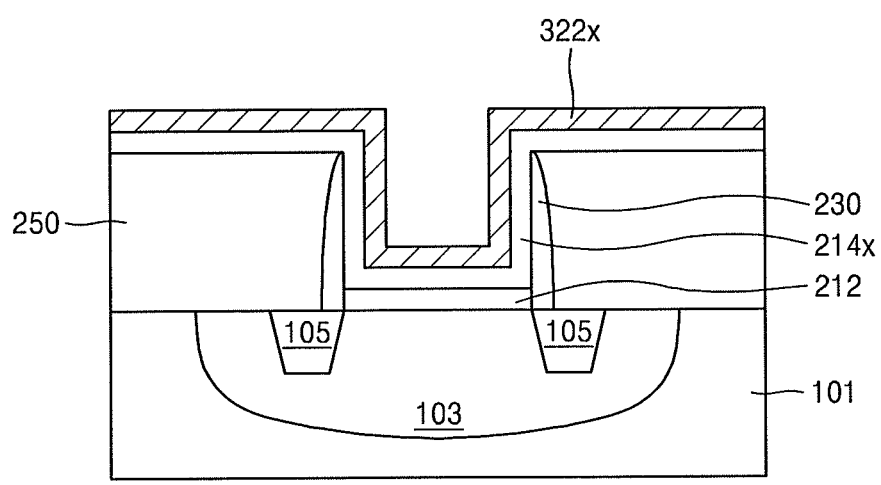

Referring to FIG. 11B, a first metal gate layer 322*x* may be formed on the gate dielectric layer 214*x*. The first metal gate layer 322*x* may have a multilayered structure including one or more of titanium nitride or tantalum nitride. The formation of the first metal gate layer 322*x* may be performed using a deposition process, such as an ALD process or a CVD process.

Figure 11C:
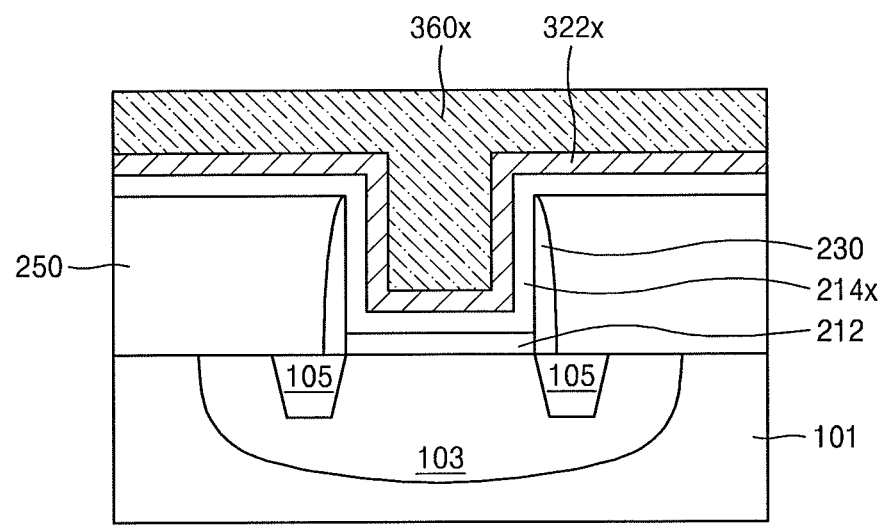

Referring to FIG. 11C, a sacrificial gate layer 360*x* may be formed on the first metal gate layer 322*x*. The sacrificial gate layer 360*x* may be, for example, a silicon nitride layer.

Figure 11D:
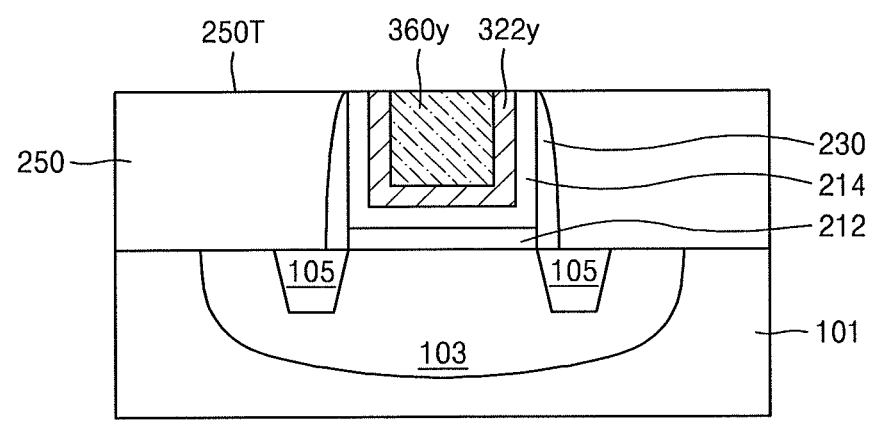

Referring to FIG. 11D, a planarization process may be performed on the sacrificial gate layer 360*x*, the first metal gate layer 322*x*, and the gate dielectric layer 214*x* to expose a top surface 250T of the interlayer insulating layer 250. The planarization process may be, for example, a CMP process. A gate layer 360*y*, a first metal gate layer 322*y*, and a gate dielectric layer 214 may respectively include the gate layer 360*x*, the first metal gate layer 322*x*, and the gate dielectric layer 214*x*, which may remain after the planarization process.

Figure 11E:
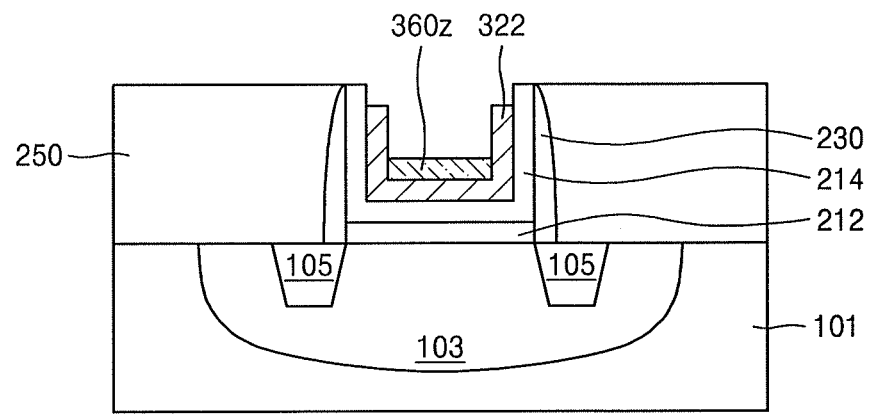

Referring to FIG. 11E, during the removal of the sacrificial gate layer (refer to 360*y* in FIG. 11D), portions of side surfaces of the first metal gate layer 322*y* may be simultaneously removed to reduce the height of side surfaces of the first metal gate layer (refer to 322*y* in FIG. 11D).

The sacrificial gate layer 360*y* may not be completely removed but partially remained. For example, a metal gate pullback process may be performed such that a consideration portion of the sacrificial gate layer 360*y* is etched and side surfaces of the first metal gate layer 322*y* are etched to a predetermined depth.

Specifically, the process of simultaneously removing the sacrificial gate layer 360*y* and the first metal gate layer 322*y* may be performed using, for example, a dry etching process. In particular, the dry etching process may be performed using a reactive ion etching (RIE) process.

When a dry etching process is performed using an RIE process under process conditions having a higher etch selectivity against the sacrificial gate layer 260*y* than against the first metal gate layer 322*y*, the sacrificial gate layer 360*y* may be etched to a greater extent than the first metal gate layer 322*y*.

During the removal of the consideration portion of the sacrificial gate layer 360*y*, the portions of the side surfaces of the first metal gate layer 322*y* may be removed to reduce the side surfaces of the first metal gate layer 322*y*.

A sacrificial gate layer 360*z* and a first metal gate layer 322 may respectively include the sacrificial gate layer 360*y* and the first metal gate layer 322*y*, which may remain after the etching process.

Figure 11F:
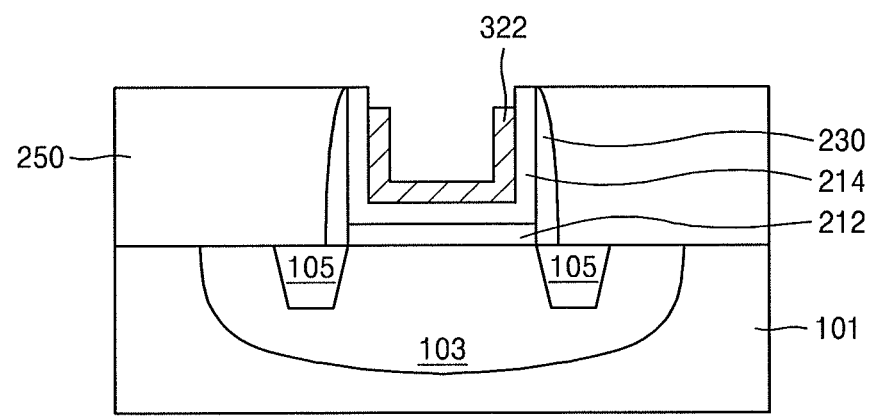

Referring to FIG. 11F, the remaining sacrificial gate layer (refer to 360*z* in FIG. 11E) may be removed. The removal of the remaining sacrificial gate layer 360*z* may be performed using, for example, a wet etching process using phosphoric acid ($H_3PO_4$). When the wet etching process is performed using phosphoric acid, an etch selectivity of the sacrificial gate layer 360*z* with respect to the first metal gate layer 322 may be about 200:1 or more, and the first metal gate layer 322 may be removed to a slight extent during the removal of the sacrificial gate layer 360*z*.

Figure 11G:
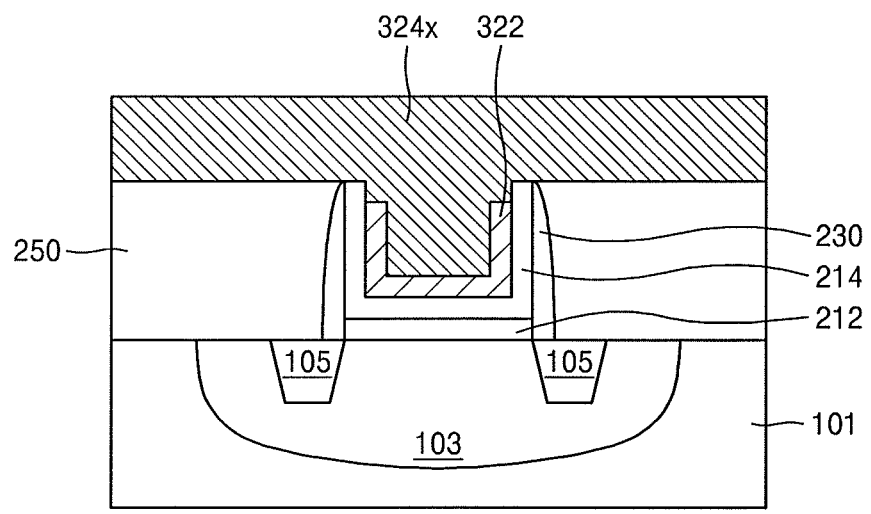

Referring to FIG. 11G, a second metal gate layer 324*x* may be formed to cover the interlayer insulating layer 250, the first metal gate layer 322, and the gate dielectric layer 214.

In some embodiments, the second metal gate layer 324*x* may have a multilayered structure including a metal nitride layer including one or more of titanium nitride or tantalum nitride, and a metal layer including one or more of aluminum, tungsten, or titanium.

The formation of the second metal gate layer 324x may be performed using a deposition process, such as an ALD process or a CVD process.

Figure 11H:
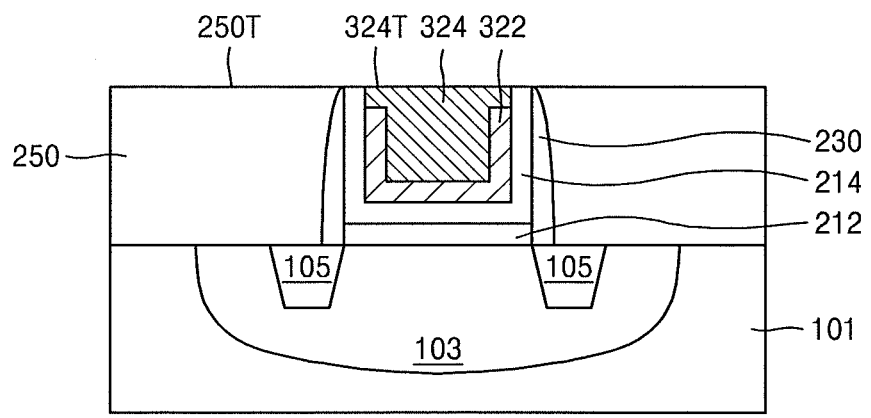

Referring to FIG. 11H, a planarization process may be performed on the second metal gate layer (refer to 324x in FIG. 11G) to expose the top surface 250T of the interlayer insulating layer 250. The planarization process may be, for example, a CMP process.

A blocking layer may be further formed in a region of a top surface 324T of a second metal gate layer 324 by performing an oxidation process during the planarization process.

Figure 11I:
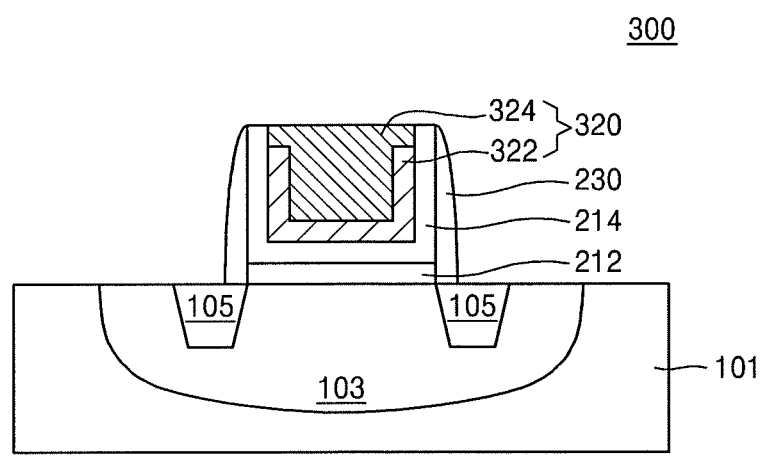

Referring to FIG. 11I, the interlayer insulating layer 250 may be removed to complete a pumping capacitor 300. The removal of the interlayer insulating layer 250 may be performed using, for example, a wet etching process.

FIGS. 12A through 12E illustrate cross-sectional views of processes of a method of fabricating a pumping capacitor according to an exemplary embodiment.

In FIGS. 12A through 12E, the same reference numerals are used to denote the same elements as in FIGS. 1 through 11I, and repeated descriptions thereof are omitted for brevity.

Figure 12A:
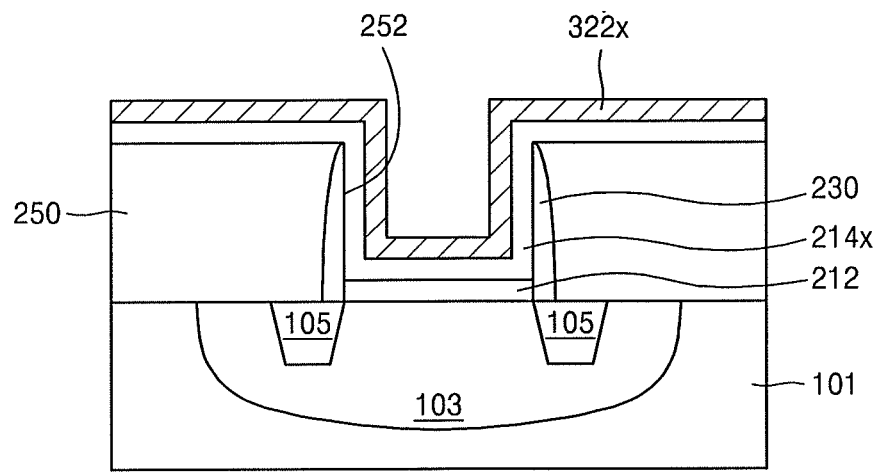
FIGS. 12A through 12E illustrate cross-sectional views of processes of a method of fabricating a pumping capacitor according to an exemplary embodiment t.

Referring to FIG. 12A, a trench 252 may be formed on a substrate 101, and a gate dielectric layer 214x may be formed to cover an inner wall of the trench 252. A first metal gate layer 422x may be formed on the gate dielectric layer 214x. Since methods of forming the trench 252, the gate dielectric layer 214x, and the first metal gate layer 422x are described above with reference to FIGS. 11A and 11B, descriptions thereof are omitted here.

Figure 12B:
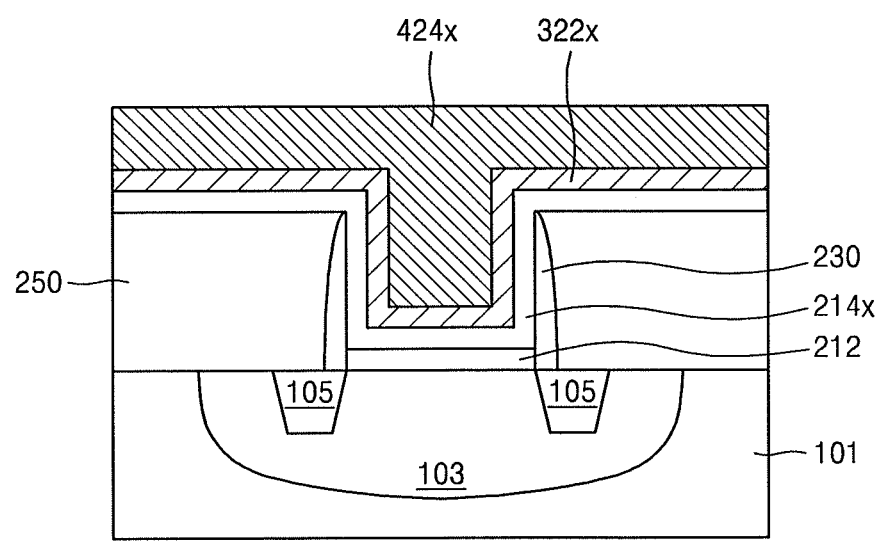

Referring to FIG. 12B, a second metal gate layer 424x may be formed on the first metal gate layer 422x.

In some embodiments, a second metal gate layer 424x may have a multilayered structure including a metal nitride layer including one or more of titanium nitride or tantalum nitride and a metal layer including one or more of aluminum, tungsten, or titanium.

The formation of the second metal gate layer 424x may be performed using a deposition process, such as an ALD process or a CVD process.

Figure 12C:
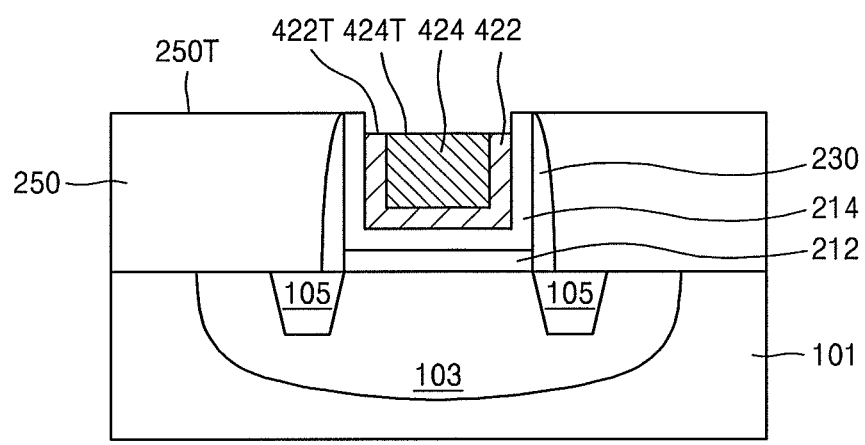

Referring to FIG. 12C, a planarization process may be performed on the first metal gate layer (refer to 422x in FIG. 12B) and the second metal gate layer (refer to 424x in FIG. 12B) to expose a top surface 250T of an interlayer insulating layer 250.

An etchback process may be performed during or after the planarization process.

A top surface 422T of a first metal gate layer 422 and a top surface 424T of a second metal gate layer 424 may be disposed at a lower level than the top surface 250T of the interlayer insulating layer 250.

Figure 12D:
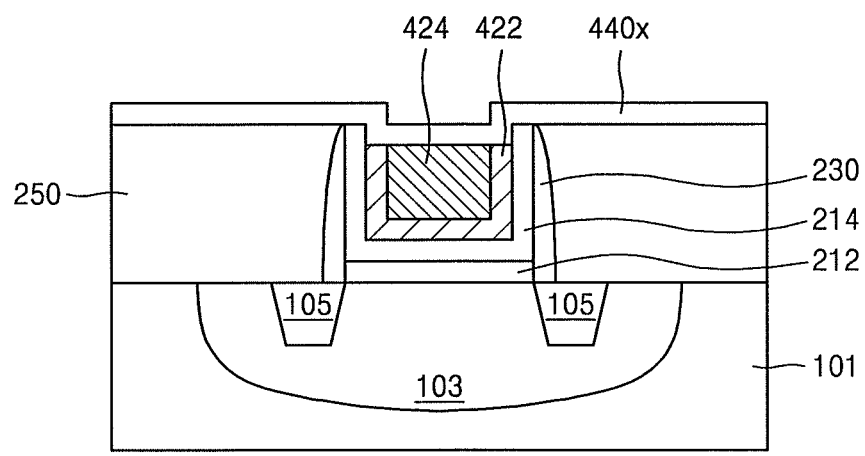

Referring to FIG. 12D, a gate layer protection layer 440x may be formed on the first metal gate layer 422, the second metal gate layer 424, and the interlayer insulating layer 250. The gate layer protection layer 440x may include for example, silicon nitride.

Figure 12E:
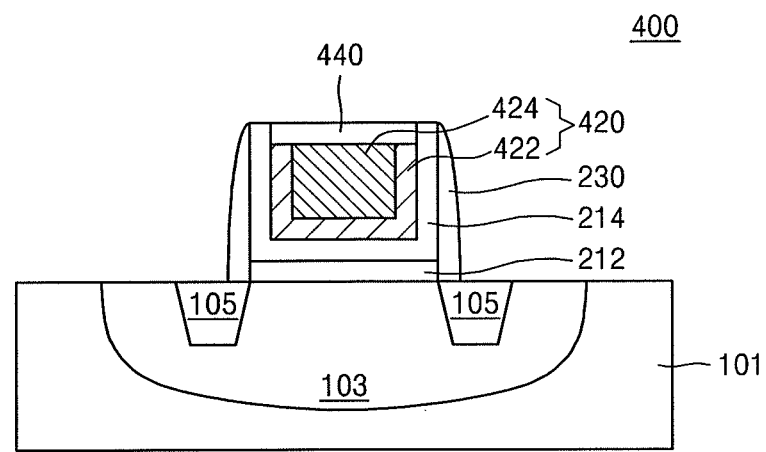

Referring to FIG. 12E, a planarization process may be performed on the gate layer protection layer 440x to expose the top surface (refer to 250T in FIG. 12D) of the interlayer insulating layer 250. Thereafter, the interlayer insulating layer 250 may be removed to complete a pumping capacitor 400.

A protection layer 440 may prevent occurrence of an undesired short between the gate layer 420 and an upper contact.

Figure 13:
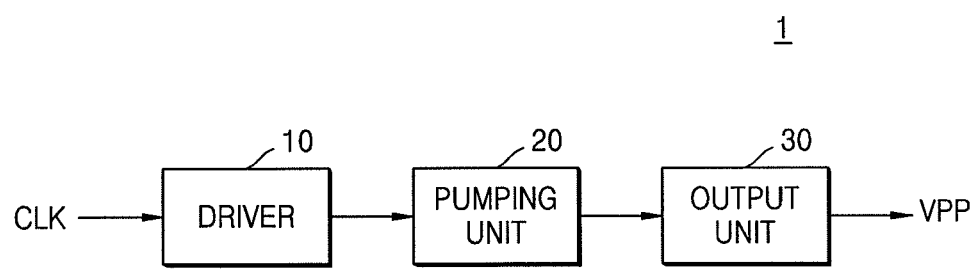
FIG. 13 illustrates a block diagram of a high-voltage generating circuit including a pumping capacitor according to exemplary embodiments.

FIG. 13 illustrates a block diagram of a high-voltage generating circuit 1 including a pumping capacitor according to exemplary embodiments.

In FIG. 13, the same reference numerals are used to denote the same elements as in FIGS. 1 through 12E, and repeated descriptions thereof are omitted for brevity.

Referring to FIG. 13, the high-voltage generating circuit 1 may include a driver 10 configured to receive a predetermined clock signal CLK and output a driving signal, a pumping unit 20 configured to receive the driving signal output by the driver unit 10 and perform a pumping operation, and an output unit 30 configured to output a high voltage VPP generated due to the pumping operation of the pumping unit 20.

In some embodiments, the pumping unit 20 may include at least one pumping capacitor. Each of the pumping capacitors may have a structure similar to the pumping capacitors 100, 200, 300, 400, and 500 according to exemplary embodiments.

Figure 14:
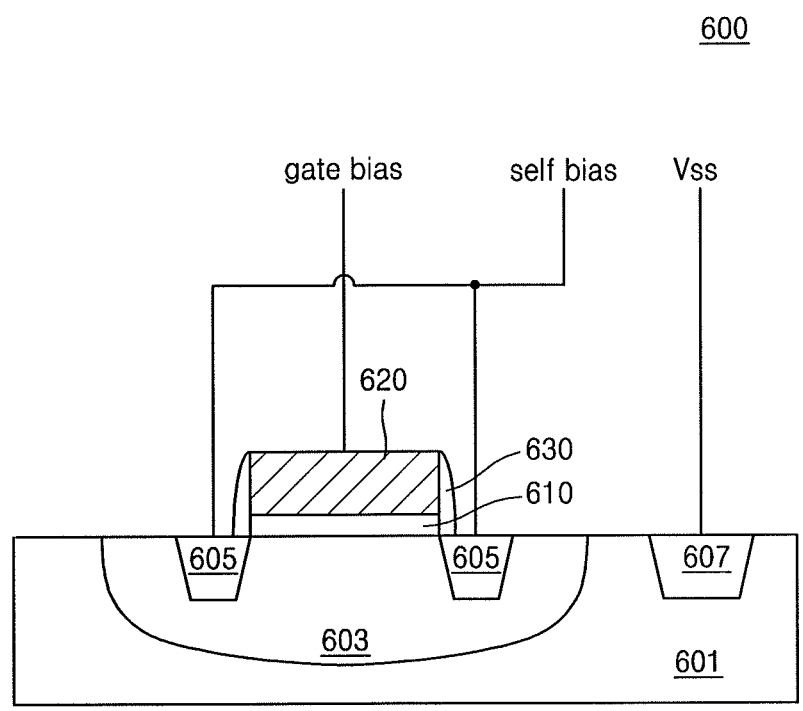
FIG. 14 illustrates a cross-sectional view of a connection structure of a pumping capacitor according to exemplary embodiments.

FIG. 14 illustrates a cross-sectional view of a connection structure of a pumping capacitor 600 according to exemplary embodiments. In FIG. 14, the same reference numerals are used to denote the same elements as in FIGS. 1 through 13, and repeated descriptions thereof are omitted for brevity.

FIG. 14 illustrates an example of a connection relationship among a gate layer 620 and a first-conductivity-type doping region 605 of the pumping capacitor 600 and an example of an arranged structure of a second-conductivity-type guard ring region 607. For example, second-conductivity-type guard ring region 607 of the pumping capacitor 600 may be omitted according to design requirements.

Referring to FIG. 14, the pumping capacitor 600 may include a substrate 601, and a gate dielectric layer 610, a gate layer 620, and a spacer 630, which are formed on the substrate 601. The substrate 601 may include a first-conductivity-type well region 603, a first-conductivity-type doping region 605, and a second-conductivity-type guard ring region 607.

In the present embodiment, the substrate 601, the first-conductivity-type well region 603, the first-conductivity-type doping region 605, the gate dielectric layer 610, the gate layer 620, and the spacer 630 may respectively have similar structures to the substrate 101, the first-conductivity-type well region 103, the first-conductivity-type doping region 105, the gate dielectric layer 110, the gate layer 120, and the spacer 130 described with reference to FIG. 1.

In some embodiments, the substrate 601 may be a P-type silicon substrate, and the second-conductivity-type guard ring region 607 may be a P-type doping region doped at a higher concentration than the substrate 601 by implanting impurities, such as boron (B). As described above with reference to FIG. 1, the first-conductivity-type well region 603 may be an N-type well region, the first-conductivity-type doping region 605 may be an N-type doping region doped at a higher concentration than the first-conductivity-type well region 603.

In some embodiments, a self-bias may be applied to the first-conductivity-type doping region 605, a gate bias may be applied to the gate layer 620, and a ground voltage Vss may be applied to the second-conductivity-type guard ring region 607. For example, the first-conductivity-type doping region 605 may be connected to a first electrode of the pumping capacitor 600, and the gate layer 620 may serve as a second electrode of the pumping capacitor 600.

By way of summation and review, in an operation of a pumping capacitor, a technique of reducing a leakage current generated between a silicon substrate and a well region in which an electrode is formed at a side of the silicon substrate and maintaining reliability may be needed. Provided is a pumping capacitor, which may prevent degradation of electrical properties and maintain reliability during operations of a device.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A pumping capacitor, comprising:
a substrate including an N-type well region and an N-type doping region in the N-type well region;
a P-type gate layer disposed on the substrate; and
a gate dielectric layer disposed between the substrate and the P-type gate layer,
wherein the P-type gate layer has a multilayered structure including a metal nitride layer and a metal layer; and
wherein the metal nitride layer is a multilayered structure including a tantalum nitride layer.

2. The pumping capacitor as claimed in claim 1, wherein the N-type doping region has a higher dopant concentration than the N-type well region.

3. The pumping capacitor as claimed in claim 1, wherein the metal layer includes one or more of aluminum (Al), tungsten (W), or titanium (Ti).

4. The pumping capacitor as claimed in claim 1, wherein the gate dielectric layer is a high-k dielectric layer having a higher dielectric constant than silicon oxide.

5. The pumping capacitor as claimed in claim 4, wherein the high-k dielectric layer includes one or more of hafnium oxide, aluminum oxide, zirconium oxide, or tantalum oxide.

6. The pumping capacitor as claimed in claim 1, further comprising:
spacers covering sidewalls of the P-type gate layer; and
a gate layer protection layer covering a top surface of the P-type gate layer.

7. A pumping capacitor, comprising:
a substrate including an N-type well region and an N-type doping region in the N-type well region;
a high-k dielectric layer disposed on the substrate, the high-k dielectric layer having a U-shaped section; and
a P-type metal gate layer disposed on the high-k dielectric layer, the P-type metal gate layer including:
a metal nitride layer having a U-shaped section; and
a metal layer covering the metal nitride layer and having a T-shaped section;
wherein a top surface of an edge of the first metal gate layer is at a lower level than a top surface of the second metal gate layer.

8. The pumping capacitor as claimed in claim 7, wherein the first metal gate layer has a multilayered structure including one or more of titanium nitride or tantalum nitride, and
the second metal gate layer includes one or more of aluminum, tungsten, or titanium.

9. The pumping capacitor as claimed in claim 7, further comprising a gate layer protection layer covering a top surface of the P-type metal gate layer.

10. The pumping capacitor as claimed in claim 1, wherein the P-type gate electrode is a P-type metal electrode.

11. The pumping capacitor as claimed in claim 1, wherein the substrate further includes:
a P-type well region; and
a P-type guard ring electrode in the P-type well region.

12. The pumping capacitor as claimed in claim 1, wherein the P-type guard ring electrode has a higher dopant concentration than the P-type well region.

13. The pumping capacitor as claimed in claim 1, wherein a self-bias is applied to the N-type doping region,
a gate bias is applied to the P-type gate electrode, and
a ground voltage is applied to the P-type guard ring electrode.

14. A pumping capacitor, comprising:
a substrate including an N-type well region and an N-type doping region in the N-type well region;
a high-k dielectric layer on the substrate, the high-k dielectric layer having a U-shaped section; and
a P-type metal gate layer on the high-k dielectric layer;
wherein the substrate includes a semiconductor fin extending in a first direction, and
wherein the P-type metal gate layer extends in a second direction that is perpendicular to the first direction, the P-type metal gate layer covering at least a portion of the semiconductor fin.

15. The pumping capacitor as claimed in claim 14, wherein:
the P-type gate layer has a multilayered structure including a metal nitride layer and a metal layer; and
the metal nitride layer is a multilayered structure including a tantalum nitride layer.

16. The pumping capacitor as claimed in claim 15, wherein the metal nitride layer multilayered structure includes a titanium nitride layer on at least one surface of the tantalum nitride layer.

17. The pumping capacitor as claimed in claim 16, wherein the metal layer is a multilayered structure including a first metal layer, a metal nitride layer, and a second metal layer stacked sequentially.

18. The pumping capacitor as claimed in claim 14, wherein the metal nitride layer has a U-shaped section; and
the metal layer covers the metal nitride layer and has a T-shaped section.

19. The pumping capacitor as claimed in claim 18, wherein a top surface of an edge of the metal nitride layer is at a lower level than a top surface of the metal layer.

20. The pumping capacitor as claimed in claim 1, wherein the metal nitride layer multilayered structure includes a titanium nitride layer on at least one surface of the tantalum nitride layer.

21. The pumping capacitor as claimed in claim 20, wherein the metal layer includes a first metal layer, a metal nitride layer, and a second metal layer stacked sequentially.

22. The pumping capacitor as claimed in claim 1, wherein:
the metal nitride layer has a U-shaped section; and
the metal layer covers the metal nitride layer and has a T-shaped section.

23. The pumping capacitor as claimed in claim 22, wherein a top surface of an edge of the metal nitride layer is at a lower level than a top surface of the metal layer.

24. The pumping capacitor as claimed in claim 7, wherein:
the P-type gate layer has a multilayered structure including a metal nitride layer and a metal layer, and
the metal nitride layer multilayered structure includes a titanium nitride layer and a tantalum nitride layer.

25. The pumping capacitor as claimed in claim 24, wherein the metal layer is a multilayered structure including a first metal layer, a metal nitride layer, and a second metal layer stacked sequentially.

* * * * *